United States Patent
Chen et al.

(10) Patent No.: US 11,973,021 B2
(45) Date of Patent: Apr. 30, 2024

(54) SEMICONDUCTOR DEVICE AND METHOD FORMING THE SAME

(71) Applicant: Vanguard International Semiconductor Corporation, Hsinchu (TW)

(72) Inventors: Kai-Chun Chen, Taoyuan (TW); Shih-Ming Tseng, Hsinchu (TW); Hsing-Chao Liu, Jhudong Township (TW); Hsiao-Ying Yang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 157 days.

(21) Appl. No.: 17/478,105

(22) Filed: Sep. 17, 2021

(65) Prior Publication Data
US 2023/0105036 A1 Apr. 6, 2023

(51) Int. Cl.
*H01L 23/522* (2006.01)
*H01L 21/768* (2006.01)
*H01L 23/528* (2006.01)

(52) U.S. Cl.
CPC .... *H01L 23/5223* (2013.01); *H01L 21/76832* (2013.01); *H01L 23/5226* (2013.01); *H01L 23/5283* (2013.01)

(58) Field of Classification Search
CPC ............ H01L 23/5223; H01L 23/5226; H01L 23/5283; H01L 21/76832
(Continued)

(56) References Cited

U.S. PATENT DOCUMENTS

| 2009/0087999 A1* | 4/2009 | Richter ............... H01L 29/7843 257/E21.24 |
| 2019/0378892 A1 | 12/2019 | Stewart et al. |

(Continued)

FOREIGN PATENT DOCUMENTS

| CN | 103579185 A | 2/2014 |
| EP | 0851480 A2 * | 7/1998 ........... H01L 21/022 |

(Continued)

OTHER PUBLICATIONS

Taiwanese Office Action and Search Report for Taiwanese Application No. 110110504, dated Jun. 25, 2022.
(Continued)

*Primary Examiner* — Tu-Tu V Ho
(74) *Attorney, Agent, or Firm* — Birch, Stewart, Kolasch & Birch, LLP

(57) ABSTRACT

A semiconductor device includes a first metal layer, a second metal layer, and an inter-metal dielectric layer disposed between the first metal layer and the second metal layer. The inter-metal dielectric layer includes: a first dielectric layer disposed on the first metal layer and in direct contact with the first metal layer, wherein the first dielectric layer has a stress value less than 0; a second dielectric layer disposed on the first dielectric layer, wherein the second dielectric layer has a stress value greater than 0; and a third dielectric layer disposed on the second dielectric layer, wherein the third dielectric layer has a stress value less than 0. A thickness of the third dielectric layer is greater than a thickness of the second dielectric layer, and the thickness of the second dielectric layer is greater than a thickness of the first dielectric layer.

18 Claims, 7 Drawing Sheets

(58) Field of Classification Search
USPC .......................................................... 257/535
See application file for complete search history.

(56) References Cited

U.S. PATENT DOCUMENTS

2020/0312760 A1    10/2020  Park et al.
2022/0278191 A1*    9/2022  Lai .................... H01L 21/76838

FOREIGN PATENT DOCUMENTS

| TW | 201731022 A | 9/2017 |
| TW | 201904005 A | 1/2019 |
| TW | 201904055 A | 1/2019 |

OTHER PUBLICATIONS

Taiwanese Office Action and Search Report for Taiwanese Application No. 110110504, dated Feb. 5, 2024.

* cited by examiner

SEMICONDUCTOR DEVICE AND METHOD FORMING THE SAME

BACKGROUND

Technical Field

The present disclosure relates to a semiconductor device and method forming the same, and in particular it relates to an inter-metal dielectric (IMD) layer and method forming the same.

Description of the Related Art

The semiconductor industry continues to improve the integration density of various electronic components by continual reductions in minimum feature size, which allow more components to be integrated into a given area. In the back-end of line (BEOL) of a semiconductor device, an isolator can function as a high-voltage component within the semiconductor device. When the semiconductor device suddenly endures an extremely high voltage during operation, such as lightning or other natural causes, the isolator can isolate the electrical current to prevent the electronic components with high integration density from being damaged. Therefore, the isolator can be widely used in power adaptors.

A high-voltage component within the semiconductor device is normally connected to a high-voltage power source, which may be nearly 15 kV of direct current or alternating current (DC/AC) voltage source. When the high-voltage component functions as a capacitor structure that is being integrated with an interconnect structure, the dielectric layers within the capacitor structure are normally constructed by the inter-metal dielectric (IMD) layers within the semiconductor device. Since the voltage tolerance of the capacitor structure is associated with the thickness of the inter-metal dielectric layers within, the thickness of the inter-metal dielectric layer would normally be increased in order to increase the voltage tolerance of the capacitor structure.

Even though increasing the thickness of the inter-metal dielectric layers can increase the voltage tolerance of the semiconductor device, other technical issues may arise. For example, increasing the thickness of the inter-metal dielectric layers results in warpage occurring on a substrate of the semiconductor device. Changing the thickness of the inter-metal dielectric layers may affect the reliability of the semiconductor device, in addition to affecting the stability of the overall structure. Therefore, while enhancing the voltage tolerance of the capacitor structure, the issues that arise when increasing the thickness of the inter-metal dielectric layers need to be addressed.

SUMMARY

In an embodiment, a semiconductor device includes a first metal layer, a second metal layer, and an inter-metal dielectric layer disposed between the first metal layer and the second metal layer. The inter-metal dielectric layer includes: a first dielectric layer disposed on the first metal layer and in direct contact with the first metal layer, wherein the first dielectric layer has a stress value less than 0; a second dielectric layer disposed on the first dielectric layer, wherein the second dielectric layer has a stress value greater than 0; and a third dielectric layer disposed on the second dielectric layer, wherein the third dielectric layer has a stress value less than 0, wherein a thickness of the third dielectric layer is greater than a thickness of the second dielectric layer, and the thickness of the second dielectric layer is greater than a thickness of the first dielectric layer.

In another embodiment, a method forming a semiconductor device includes: forming a first metal layer on an inter-layer dielectric layer; forming an inter-metal dielectric layer on the first metal layer; and forming a second metal layer on the inter-metal dielectric layer. Steps of forming the inter-metal dielectric layer includes: conformally depositing a first dielectric layer on the first metal layer using a first deposition method, wherein the first dielectric layer has a stress value less than 0; conformally depositing a second dielectric layer on the first dielectric layer using a second deposition method different from the first deposition method, wherein the second dielectric layer has a stress value greater than 0; and depositing a third dielectric layer on the second dielectric layer using the first deposition method.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1A:
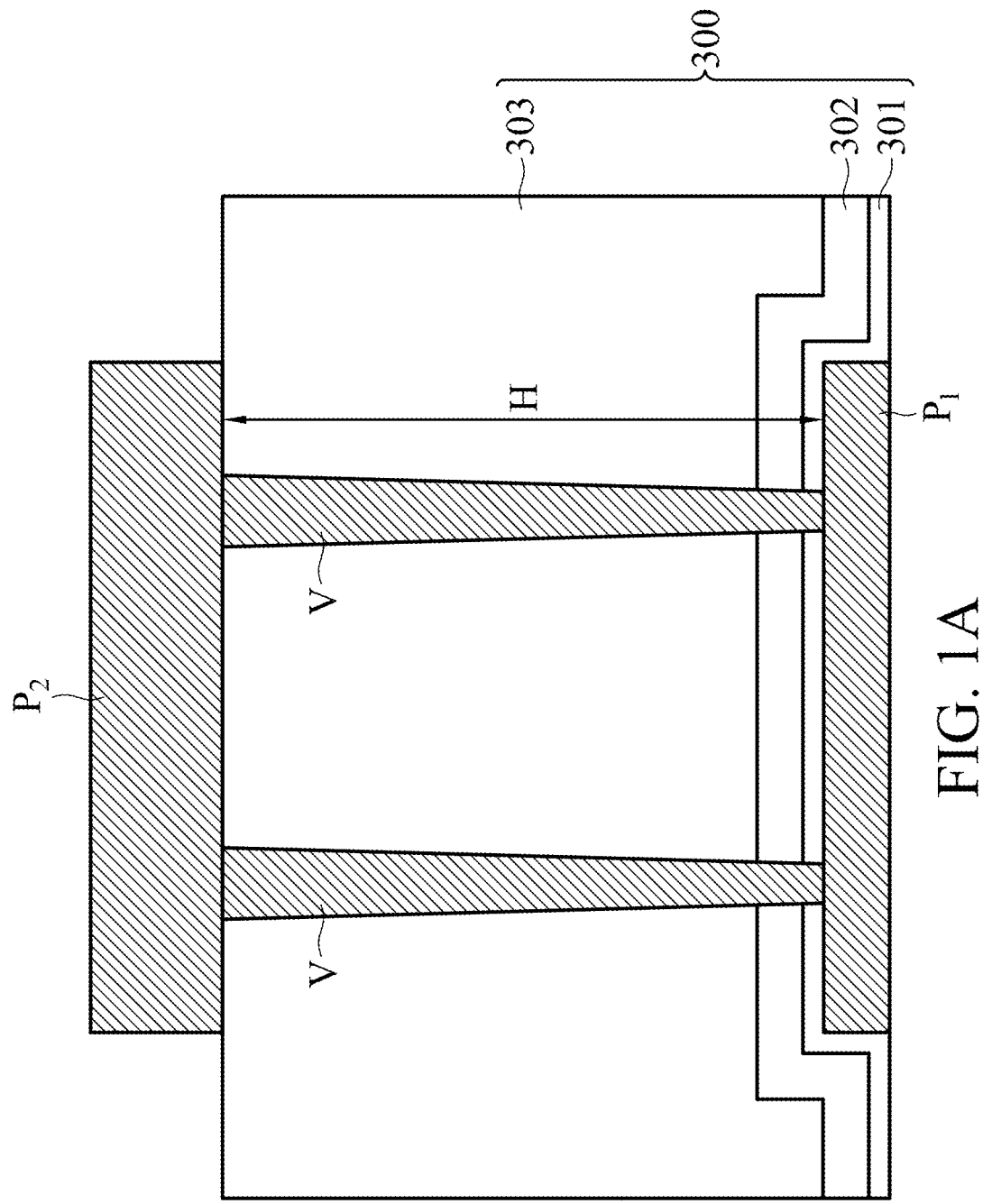
FIGS. 1A-1C illustrate cross-sectional views of a semiconductor device, according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity, and does not in itself dictate a relationship between various embodiments and/or configuration discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about," "approximately" and "substantially" as used herein typically mean±20% of the stated value, more typically ±10% of the stated value, more typically ±5% of the stated value, more typically ±3% of the stated value, more typically ±2% of the stated value, more typically ±1% of the stated value and even more typically ±0.5% of the stated value. The stated value of the present disclosure is an approximate value. That is, when there is no specific description of the terms "about," "approximately" and "substantially", the stated value includes the meaning of "about," "approximately" or "substantially".

Some embodiments of the disclosure are described. Additional operations can be provided before, during, and/or after the stages described in these embodiments. Additional features can be added to the semiconductor device structure. Some of the features described below can be replaced or eliminated for different embodiments. Although some embodiments are discussed with operations performed in a particular order, these operations may be performed in another logical order.

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the prior art and will not be interpreted in an idealized or overly formal sense unless expressly so defined in the embodiments of the present disclosure.

In the semiconductor device fabrication, an inter-metal dielectric (IMD) layer is disposed between each metal layer and its overlying metal layer and/or underlying metal layer at back-end of line (BEOL). In interconnect structures, the metal layer is electrically coupled to the overlying metal layer and/or the underlying metal layer through vias, which is achieved by penetrating the vias through every inter-metal dielectric layer between the metal layers. In capacitor structures, the underlying metal layer may function as a lower electrode for the capacitor structure, and the overlying metal layer may function as an upper electrode for the capacitor structure, the inter-metal dielectric layer between the upper electrode and the lower electrode does not have any via present. A typical semiconductor device may integrate the interconnect structure and the capacitor structure together to enhance circuit integration density.

Embodiments of the present disclosure provide a semiconductor device and method forming the same, which can particularly apply to an inter-metal dielectric layer. Due to limitation of various factors, thicknesses of conventional inter-metal dielectric layers cannot be increased. For example, when the thickness of the inter-metal dielectric layer is too large, the stress generated may be too large, resulted in warpage occurring on the underlying substrate, thereby affecting the overall integrity of the semiconductor device. Even though every inter-metal dielectric layer may be composed of multiple dielectric layers each with smaller thicknesses, having a large number of dielectric layers may increase the number of interfaces within the inter-metal dielectric layer, which in turn increases the probability of defects. Furthermore, the thickness of the inter-metal dielectric layer directly affects the breakdown voltage of the capacitor structure, or the voltage tolerance of the capacitor structure. Under the condition where the thickness is restricted, a single inter-metal dielectric layer cannot satisfy the breakdown voltage that the capacitor structure needs to achieve. Therefore, the capacitor structure typically has a plurality of inter-metal dielectric layers. The number of the inter-metal dielectric layers may depend on the required breakdown voltage of the semiconductor device, which in turn determines the number of additional metal layers and vias needed to be disposed in the interconnect structure for accommodation.

Figure 1B:
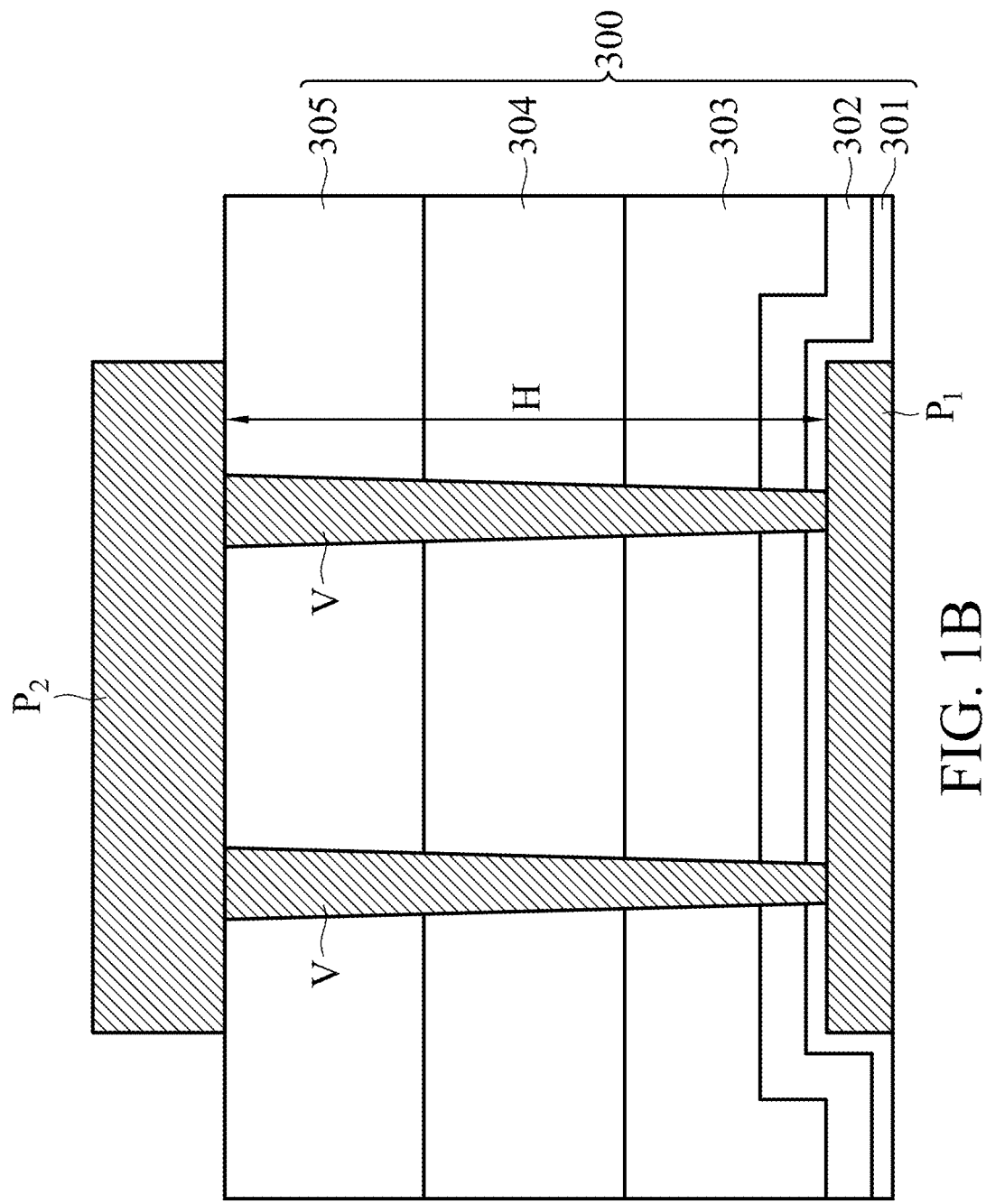
Figure 1C:
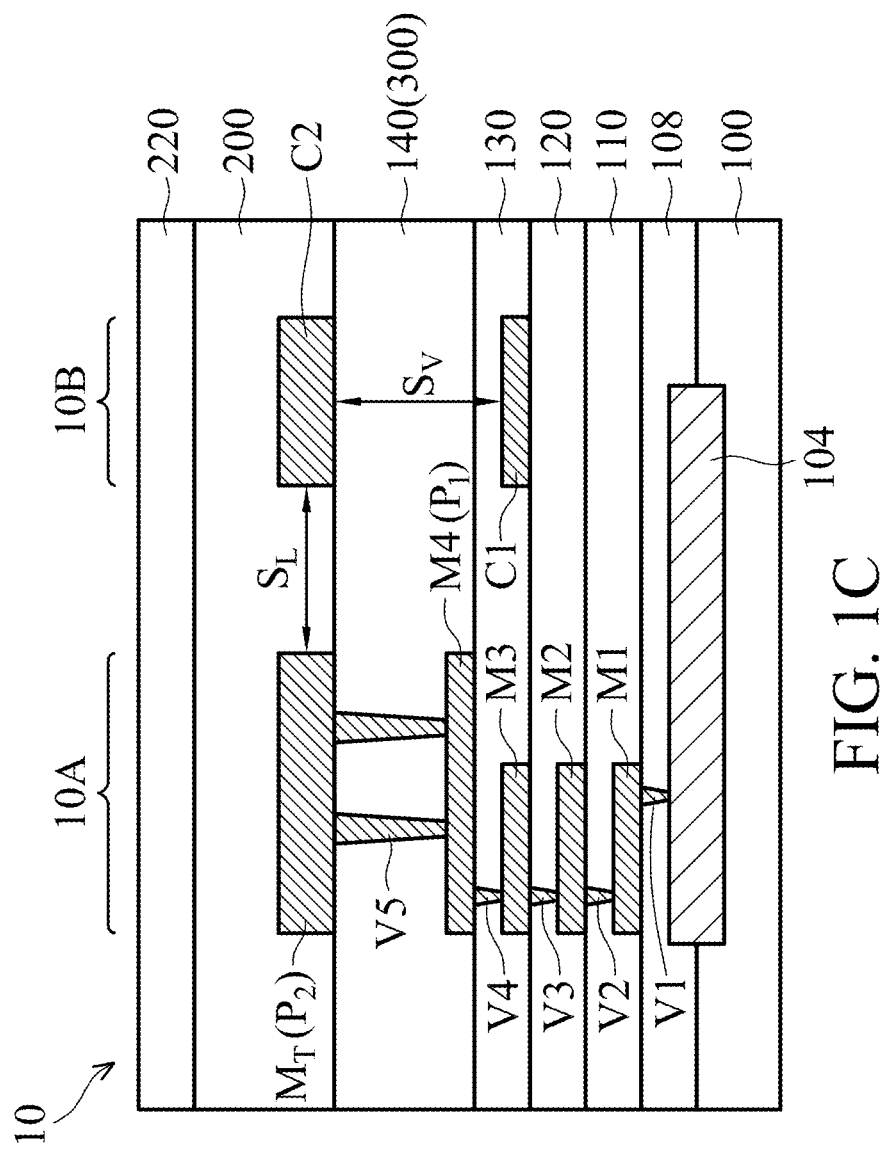

FIGS. 1A-1C illustrate cross-sectional views of a semiconductor device 10, according to some embodiments of the present disclosure. Please refer to FIGS. 1A and 1B, according to some embodiments of the present disclosure, an inter-metal dielectric layer 300 is disposed between a metal layer $P_1$ and a metal layer $P_2$, wherein a via V penetrates through the inter-metal dielectric layer 30) and electrically couples the metal layer $P_1$ and the metal layer $P_2$, thus forming an interconnect structure. The inter-metal dielectric layer 300 includes dielectric sublayers of different stress types. The inter-metal dielectric layer 300 includes a first dielectric layer 301, a second dielectric layer 302, and a third dielectric layer 303. In FIG. 1B, the inter-metal dielectric layer 300 further includes a fourth dielectric layer 304 and a fifth dielectric layer 305.

According to some embodiments of the present disclosure, the first dielectric layer 301 and the second dielectric layer 302 are conformally formed on the surface of the metal layer $P_1$, while the third dielectric layer 303 (and/or the fourth dielectric layer 304 and the fifth dielectric layer 305) has a planar upper surface. In FIG. 1A, the first dielectric layer 301 and the third dielectric layer 303 may be compressive dielectric layers having a negative stress value (less than 0), while the second dielectric layer 302 may be a tensile dielectric laver having a positive stress value (larger than 0). The formation of the first dielectric layer 301 and the third dielectric layer 303 may use the same deposition method, such as plasma-enhanced chemical vapor deposition (PECVD), but the present disclosure is not limited thereto. The formation of the second dielectric layer 302 may use a different deposition method from the first dielectric layer 301 and the third dielectric layer 303, such as sub-atmospheric chemical vapor deposition (SACVD), but the present disclosure is not limited thereto.

According to some embodiments of the present disclosure, a thickness of the third dielectric layer 303 is larger than a thickness of the second dielectric layer 302, and the thickness of the second dielectric layer 302 is larger than a thickness of the first dielectric layer 301. In order to prevent the formation of voids during deposition (for example, between the metal layer and the dielectric layer), the first dielectric layer 301 and/or the second dielectric layer 302 near the metal layer $P_1$ may be designed to have higher gap-filling capability and smaller thickness. In addition, the absolute value of the stress of the third dielectric layer 303 is larger than the absolute value of the stress of the first dielectric layer. It is appreciated that, since the thickness of the third dielectric layer 303 is larger than the thickness of the first dielectric layer 301, the power consumption for depositing the third dielectric layer 303 may be larger than the power consumption for depositing the first dielectric layer 301 when using the same plasma-enhanced chemical vapor deposition. The operating pressure needed using plasma-enhanced chemical vapor deposition is smaller than the operating pressure needed using sub-atmospheric chemical vapor deposition.

Still refer to FIG. 1A, the first dielectric layer 301 may first be deposited conformally on the surface of the metal layer $P_1$, the first dielectric layer 301 is in direct contact with the metal layer $P_1$. The thickness of the first dielectric layer 301 may be between about 0.1 µm and 0.3 µm, with the stress value between about $-5\times10^8$ dynes/cm$^2$ and $-9\times10^8$ dynes/cm$^2$. For example, the first dielectric layer 301 may be formed using, for example, plasma-enhanced chemical vapor deposition. Next, the second dielectric layer 302 is deposited on the first dielectric layer 301. The thickness of the second dielectric layer 302 may be between about 0.2 µm and 0.5 µm, with the stress value between about $2\times10^9$ dynes/cm$^2$ and $5\times10^9$ dynes/cm$^2$. For example, the second dielectric layer 302 may be formed using sub-atmospheric chemical vapor deposition. Then, the third dielectric layer 303 is formed on the second dielectric layer 302. The thickness of the third dielectric layer 303 may be between about 5.6 µm and 6.0 µm, with the stress value between about $-8\times10^8$ dynes/cm$^2$ and $-3\times10^9$ dynes/cm$^2$. For example, the third dielectric layer 303 may be formed using plasma-enhanced chemical vapor deposition. Lastly, a plananzation process is performed on the third dielectric layer 303, completing the process of the inter-metal dielectric layer 300. In such embodiment, the height H of the inter-metal dielectric layer 300 may be between about 5.5 µm and 7.0 µm.

Please refer to FIG. 1B, comparing to FIG. 1A, further includes the fourth dielectric layer 304 and the fifth dielectric layer 305. A thickness of the fourth dielectric layer 304 may be between about 2.0 µm and 3.0 µm, with the stress value between about $-8\times10^8$ dynes/cm$^2$ and $-3\times 10^9$ dynes/cm$^2$. For example, the fourth dielectric layer 304 may be formed using plasma-enhanced chemical vapor deposition, followed by a planarization process. Then, the fifth dielectric layer 305 may be deposited on the fourth dielectric layer 304. The thickness of the fifth dielectric layer 305 may be between about 2.0 µm and 3.0 µm, with the stress value between about $-8\times10^8$ dynes/cm$^2$ and $-3\times10^9$ dynes/cm$^2$. For example, the fifth dielectric layer 305 may be formed using plasma-enhanced chemical vapor deposition, followed by the planarization process. After planarizing the fifth dielectric layer 305, the process of the inter-metal dielectric layer 300 is completed. In such embodiment, the height H of the inter-metal dielectric layer 300 may be between about 6.5 µm and 7.5 µm.

Dielectric sublayers having different stress directions are disposed within the inter-metal dielectric layer 300, such that the stress between dielectric layers may be balanced. In this way, the thickness of each dielectric layer may be increased (or the total thickness of the inter-metal dielectric layer may be increased), while the overall stress of the inter-metal dielectric layer can still be controlled within an acceptable range. For example, the inter-metal dielectric layer may simultaneously include dielectric layers with compressive stress and dielectric layers with tensile stress therein. In some embodiments, compressive dielectric layers may have negative stress value (less than 0), while tensile dielectric layers may have positive stress value (larger than 0). Under the condition without dielectric sublayers of different stress types, conventional inter-metal dielectric layers may need to add numerous extra dielectric layers in order to achieve the same thickness of the inter-metal dielectric layer of the present disclosure, leading to excessive interfaces within each inter-metal dielectric layer, which in turn increases the probability of defects. As described above, dielectric layers adjacent to the metal layer need to have higher gap-filling capability, therefore the thickness of these dielectric layers needs to be considered. Other dielectric layers also need to undergo special stress adjustment to avoid warpage occurring on the substrate. Dielectric layers of different materials and different thicknesses may generate different positive stress value or negative stress value by allocating different deposition tools or deposition parameters. Therefore, the present disclosure may effectively control the overall stress of the inter-metal-dielectric layer to prevent warpage occurring on the substrate, while having sufficient thickness to enhance the breakdown voltage of the capacitor structure (or isolator).

FIG. 1C illustrates a cross-sectional view of forming the semiconductor device 10, according to some embodiments of the present disclosure. In the present embodiment, elements shown in FIG. 1C are illustrative, and it is not intended to be limiting. As shown in FIG. 1C, the semiconductor device 10 may include: a substrate 100, an integrated circuit element 104, an inter-layer dielectric (ILD) layer 108, a first metal layer M1, a first inter-metal dielectric layer 110, a second metal layer M2, a second inter-metal dielectric layer 120, a third metal layer M3, a third inter-metal dielectric layer 130, a fourth metal layer M4, a fourth inter-metal dielectric layer 140, a top metal layer $M_T$, a lower electrode C1, an upper electrode C2, a first protection layer 200, and a second protection layer 220.

In some embodiments of the present disclosure, the semiconductor device 10 may include an interconnect structure 10A and a capacitor structure 10B. The interconnect structure 10A may further include: vias V1-V5, and metal layers M1-M4 and $M_T$ are electrically connected by vias V1-V5. In some embodiments, the first inter-metal dielectric layer 110, the second inter-metal dielectric layer 120, and the third inter-metal dielectric layer 130 are dielectric layers of a single stress type. In the present embodiments, the fourth metal layer M4, the top metal layer $M_T$, the via V5, and the fourth inter-metal dielectric layer 140 of FIG. 1C may correspond to the metal layer $P_1$, the metal layer $P_2$, the via V. and the inter-metal dielectric layer 300 described in FIG. 1A (or FIG. 1B), where the fourth inter-metal dielectric layer 140 has dielectric sublayers of different stress types.

In some embodiments of the present disclosure, the capacitor structure 10B does not include any via structures between the lower electrode C1 and the upper electrode C2. The third metal layer M3 and the lower electrode C1 of the capacitor structure 10B are on the same level, while the top metal layer $M_T$ and the upper electrode C2 are on the same level. There may be a vertical spacing $S_V$ between the lower electrode C1 and the upper electrode C2, across the fourth inter-metal dielectric layer 140 and a portion of the third inter-metal dielectric layer 130, where the vertical spacing $S_V$ may be between about 1 µm and 6 µm. Furthermore, there may be a lateral spacing $S_L$ between the interconnect structure 10A and the capacitor structure 10B, where the lateral spacing $S_L$ may be between about 8 µm and 30 µm, for example, between about 10 µm and 20 µm. In one embodiment, the vertical spacing $S_V$ and the lateral spacing $S_L$ are equal, or the lateral spacing $S_L$ needs to be larger than the vertical spacing $S_V$, for example, the lateral spacing $S_L$ is 2 to 10 times the vertical spacing $S_V$. Such arrangement can ensure that voltage tolerance of the semiconductor device 10 in operation is in the direction between the lower electrode C1 and the upper electrode C2 of the capacitor structure 10B, while preventing breakdown voltage between the top metal layer $M_T$ of the interconnect structure 10A and the upper electrode C2 of the capacitor structure 10B.

In order to simply the drawings, the present embodiment only illustrates a portion of the semiconductor device. For example, the semiconductor device 10 may have other elements, such as transistors, metal lines, inductors, resistors, diodes, bonding pads, package components, etc. As previously mentioned, the first inter-metal dielectric layer 110, the second inter-metal dielectric layer 120, and the third inter-metal dielectric layer 130 are dielectric sublayers of a single stress type. The fourth inter-metal dielectric layer 140 may include dielectric sublayers of different stress types described above. In some embodiments, the relatively thicker fourth inter-metal dielectric layer 140 and the portion of the third inter-metal dielectric layer 130 disposed between the lower electrode C1 and the upper electrode C2 of the capacitor structure 10B may enhance the breakdown voltage, or the voltage tolerance, of the capacitor structure 10B.

Please refer to FIG. 1C, the substrate 100 may be, for example, a wafer or a chip, but the present disclosure is not limited thereto. In some embodiments, the substrate 100 may be a semiconductor substrate, for example, silicon substrate. In other embodiments, the substrate 100 may also be a semiconductor on insulator (SOI) substrate. The semiconductor on insulator substrate may include a base plate, a buried oxide (BOX) layer disposed on the base plate, and a semiconductor layer disposed on the buried oxide layer.

In some embodiments, the substrate 100 may include various isolation elements (not shown) to define active regions, and to electrically isolate active region elements within or above the substrate 100. In some embodiments, isolation elements may include shallow trench isolation (STI) structures, local oxidation of silicon (LOCOS) structures, the like, or combinations thereof. In some embodiments, transistors, well regions, buried bit lines, or the like may be formed in the active regions (defined by the isolation elements).

Please refer to FIG. 1C, the inter-layer dielectric layer 108 may be formed on the substrate 100 to cover the integrated circuit element 104. In some embodiments, materials of the inter-layer dielectric layer 108 may include silicon oxide (SiO), silicon nitride (SiN), silicon carbide (SiC), silicon oxynitride (SiON), silicon carbon oxynitride (such as $SiO_xN_yC_{1-x-y}$, wherein x and y are in the range from 0 to 1), tetraethylorthosilicate (TEOS), undoped silicate glass, or doped silicon oxide (such as boron-doped phospho-silicate glass (BPSG), fused silica glass (FSG), phosphosilicate glass (PSG), boron doped silicon glass (BSG)), low-k dielectric materials, or other suitable dielectric materials. In a specific embodiment, the inter-layer dielectric layer 108 may be phosphosilicate glass. In some embodiments, the inter-layer dielectric layer 108 may provide protection and insulation for underlying films, and the details are not described herein.

Still refer to FIG. 1C, the via V1 may be used to electrically connect the integrated circuit element 104 to the first metal layer M1 above the inter-layer dielectric layer 108. In some embodiments, the vias V1-V5 and the metal layers M1-M4 and $M_T$ may include amorphous silicon, polysilicon, poly-SiGe, metal nitride (such as titanium nitride (TiN), tantalum nitride (TaN), tungsten nitride (WN), titanium aluminum nitride (TiAlN), or the like), metal silicide (such as nickel silicide (NiSi), cobalt silicide (CoSi), tantalum silicon nitride (TaSiN), or the like), metal carbide (such as tantalum carbide (TaC), tantalum carbonitride (TaCN), or the like), metal oxide, and metals. Metals may include cobalt (Co), ruthenium (Ru), aluminum (Al), tungsten (W), copper (Cu), titanium (Ti), tantalum (Ta), silver (Ag), gold (Au), nickel (Ni), the like, combinations thereof, or the multiple layers thereof. As mentioned previously, the third metal layer M3 of the interconnect structure 10A and the lower electrode C1 of the capacitor structure 10B are on the same level, while the top metal layer $M_1$ of the interconnect structure 10A and the upper electrode C2 of the capacitor structure 10B are on the same level.

According to some embodiments of the present disclosure, the inter-metal dielectric layers 110, 120, and 130 are preferred to be formed of low-k dielectric materials. For example, the dielectric constant of the low-k dielectric materials may be lower than 3.0. For example, the materials of the inter-metal dielectric layers 110, 120, and 130 may include Hydrogen SilsesQuioxane, MethylSilsesQuioxane, or the like. In a specific embodiment, the inter-metal dielectric layers of the present disclosure may be silicon oxide. If every inter-metal dielectric layer used similar material as the inter-layer dielectric layer 108 (such as phosphosilicate glass), leakage current may be resulted easily and the breakdown voltage (or voltage tolerance) of the semiconductor device 10 may be degraded. In one embodiment, the thicknesses of the inter-metal dielectric layers 110, 120, and 130 may be between about 0.5 μm and 2.0 μm, for example, between about 0.8 μm and 1.5 μm. In some embodiments, the portion of the third inter-metal dielectric layer 130 and the fourth inter-metal dielectric layer 140 (corresponds to the inter-metal dielectric layer 300 of FIGS. 1A and 1B) are disposed between the lower electrode C1 and the upper electrode C2 of the capacitor structure 10B.

Please refer to FIG. 1C, the first protection layer 200 may be covered on the fourth inter-metal dielectric layer 140, the top metal layer $M_T$, and the upper electrode C2, so the top metal layer $M_T$ and the upper electrode C2 are wrapped within the first protection layer. In some embodiments, materials of the first protection layer 200 may include Hydrogen SilsesQuioxane, MethylSilsesQuioxane, or the like. In a specific embodiment, the material of the first protection layer 200 may be silicon oxide. The first protection layer 200 may be formed by chemical vapor deposition (CVD), high-density plasma chemical vapor deposition (HDP-CVD), plasma-enhanced chemical vapor deposition, flowable chemical vapor deposition (FCVD), sub-atmospheric chemical vapor deposition, the like, or combinations thereof. The thickness of the first protection layer 200 may be between about 1 μm and 5 μm, for example, between about 1.5 μm and 4.0 μm. In some embodiments, the first protection layer 200 can protect underlying films from subsequent processes, and can further enhance the breakdown voltage of the capacitor structure 10B.

Still refer to FIG. 1C, the second protection layer 220 may be formed on the first protection layer 200. In some embodiments, the second protection layer 220 may include similar materials as the inter-layer dielectric layer 108, and may be formed using similar methods, and the details are not described again herein to avoid repetition. In a specific embodiment, the material of the second protection layer 220 may include silicon nitride. The thickness of the second protection layer 220 may be between about 0.5 μm and 3.0 μm, for example, between about 0.6 μm and 2.5 μm. In a preferred embodiment, the second protection layer 220 can prevent intrusion of external moisture from causing short circuitry, in addition to providing protection on the first protection layer 200. However, as mentioned previously, the material of the second protection layer 220 may easily result in leakage current, which in turn degrade the breakdown voltage (or the voltage tolerance) of the semiconductor device 10. Therefore, the first protection layer 200 and the second protection layer 220 may be arranged together to enhance the overall device reliability.

Figure 1D:
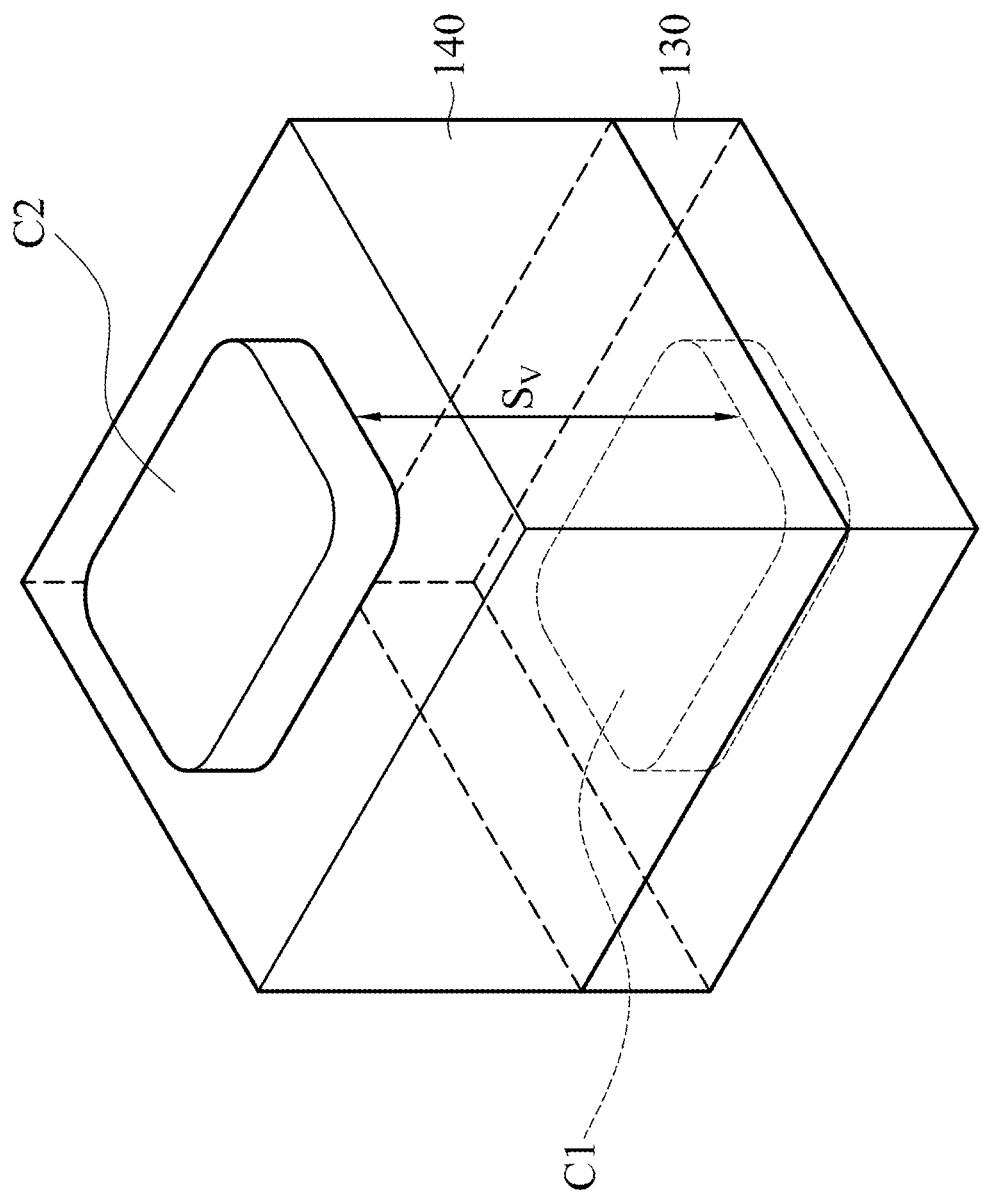
FIG. 1D illustrates a 3D view of a portion of the semiconductor device shown in FIG. 1C, according to some embodiments of the present disclosure.

FIG. 1D illustrates a perspective view of a portion of the capacitor structure 10B of the semiconductor device 10 shown in FIG. 1C, according to some embodiments of the present disclosure. In the structure shown in FIG. 1D, there may be the vertical spacing $S_V$ between the lower electrode C1 and the upper electrode C2 across the fourth inter-metal dielectric layer 140 and the portion of the third inter-metal dielectric layer 130. In conventional isolators, only the upper electrode C2 of the capacitor structure 10B is typically formed with round corners to prevent corona discharge. However, in response to the relatively thicker fourth inter-metal dielectric layer 140, the lower electrode C1 of the capacitor structure 10B and/or the metal layers of the interconnect structure 10A of the present disclosure are also designed with round corners. When both the lower electrode C1 and the upper electrode C2 of the capacitor structure 10B have round corners, formation of void may be further prevented near the metal layer sharp corners due to thin film deposited by chemical vapor deposition.

Figure 1E:
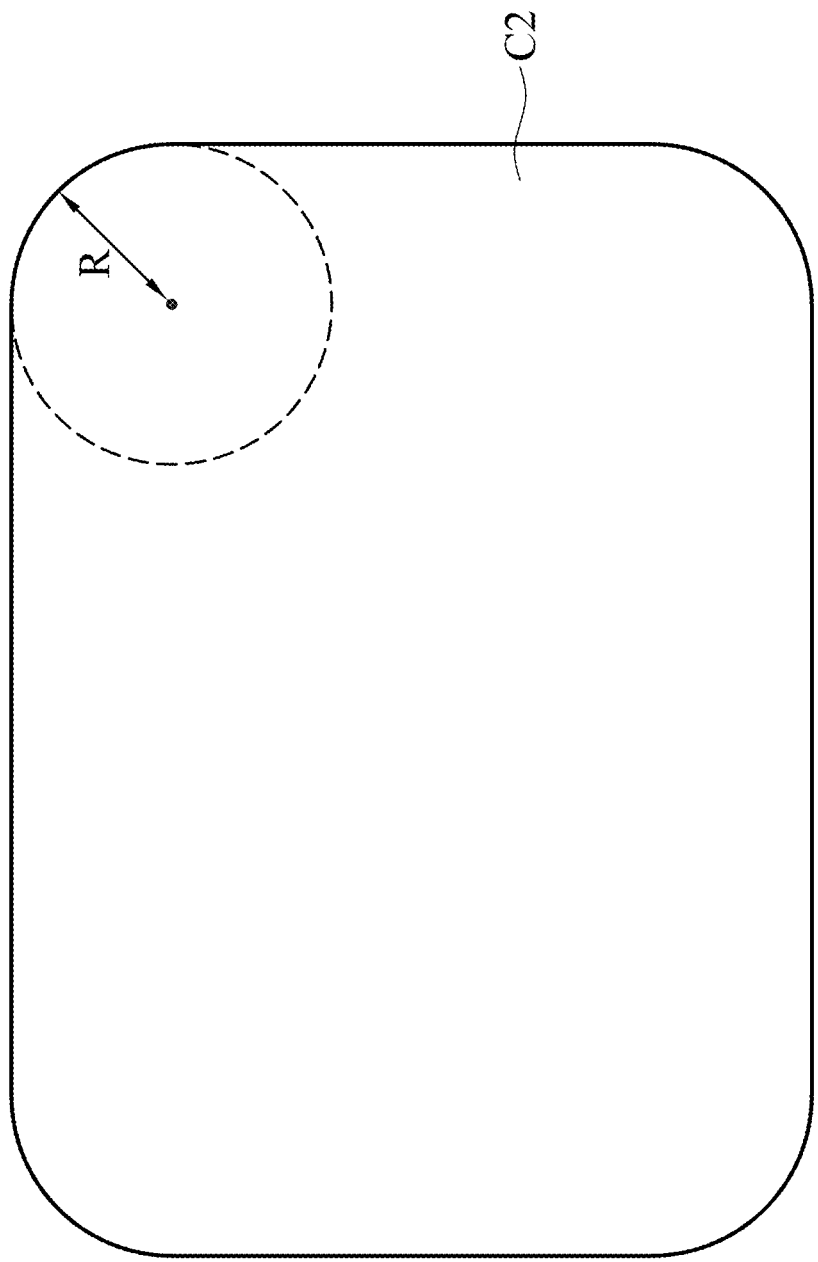
FIG. 1E illustrates a top view of the semiconductor device shown in FIG. 1D, according to some embodiments of the present disclosure.

FIG. 1E illustrates a top view of the upper electrode C2 of the capacitor structure 10B shown in FIG. 1D, according to some embodiments of the present disclosure. The lower electrode C1 and the upper electrode C2 are both formed with partial circles having a radius of curvature R, which is the radius of the partial circles intersected by sidewalls of the metal layers. According to some embodiments of the present disclosure, the radius of curvature R may be between about 0.01 μm and 0.20 μm. If the radius of curvature R were less than 0.01 μm, the round corners of the metal layers may become too sharp, causing potential stress value to increase and affecting the structure of the semiconductor device 10.

Figure 2:
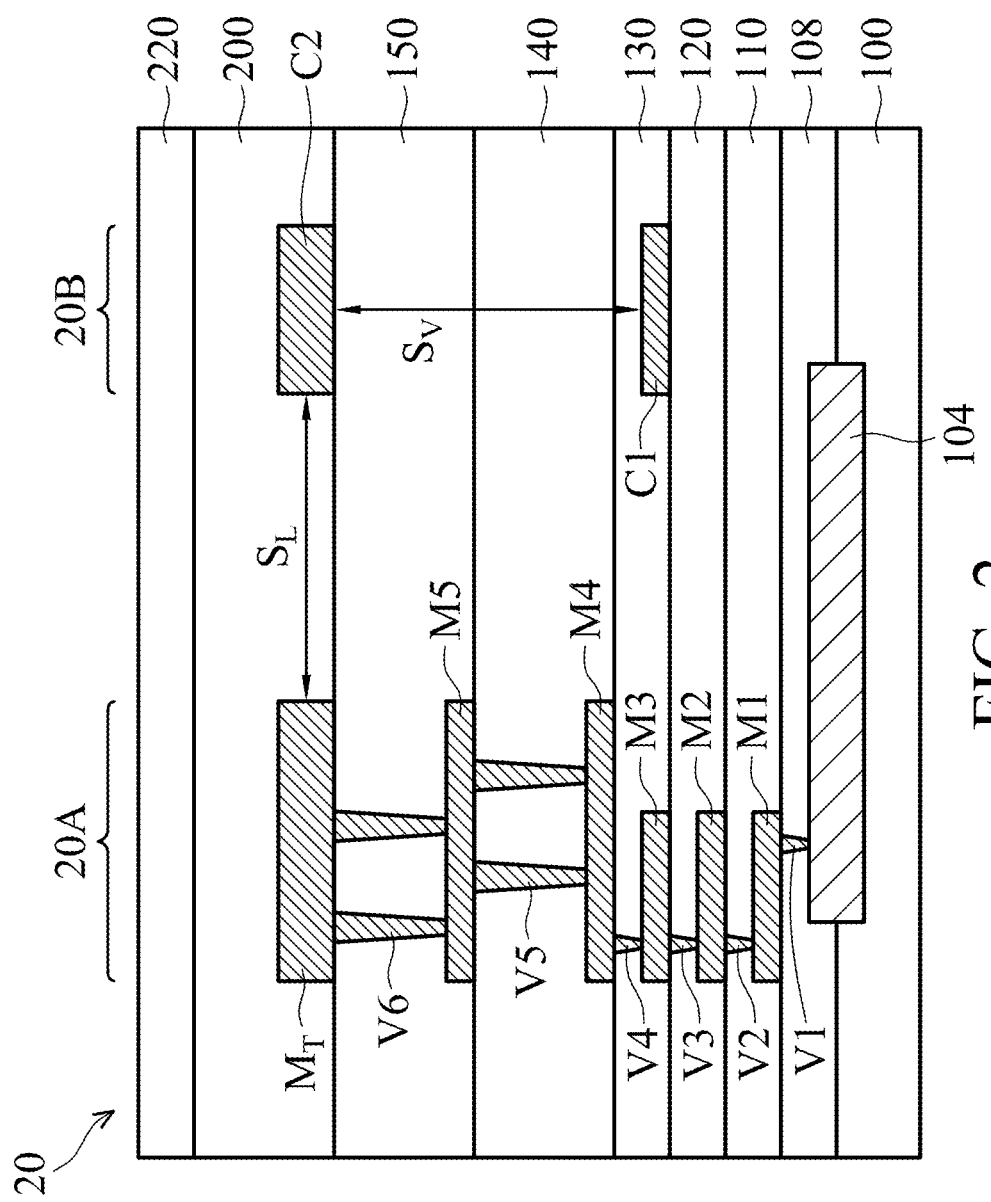
FIG. 2 illustrates a cross-sectional view of a semiconductor device, according to other embodiments of the present disclosure.

FIG. 2 illustrates a cross-sectional view of a semiconductor device 20, according to other embodiments of the present disclosure. The semiconductor device 20 includes an interconnect structure 20A and a capacitor structure 20B. In comparison with the semiconductor device 10 shown in FIG. 1C, the semiconductor device 20 further includes a fifth inter-metal dielectric layer 150, a fifth metal layer M5, and a via V6. In some embodiments, the fifth inter-metal dielectric layer 150 may include similar materials to those of the fourth inter-metal dielectric layer 140, and may be formed using similar methods (refer to the inter-metal dielectric layer 300 in FIGS. 1A and 1B described above), and the details are not described again herein to avoid repetition. In some embodiments, the fifth inter-metal dielectric layer 150 is interposed between the lower electrode C1 and the upper electrode C2 of the capacitor structure 20B, which can further enhance the breakdown voltage of the semiconductor device.

In comparison with the semiconductor device 10, the semiconductor device 20 has a larger vertical spacing $S_V$, measured between the lower electrode C1 and the upper electrode C2 of the capacitor structure 20B, across the fifth inter-metal dielectric layer 150, the fourth inter-metal dielectric layer 140, and the portion of the third inter-metal dielectric layer 130, where the vertical spacing $S_V$ may be between about 8 μm and 14 μm, for example, 12.8 μm. As mentioned previously, the vertical spacing $S_V$ and the lateral spacing $S_L$ are equal, or the lateral spacing $S_L$ needs to be larger than the vertical spacing $S_V$, for example, the lateral spacing $S_L$ is 2 to 10 times the vertical spacing $S_V$. Such arrangement can ensure that voltage tolerance of the semiconductor device 20 in operation is in the direction between the lower electrode C1 and the upper electrode C2 of the capacitor structure 20B, while preventing the breakdown voltage between the top metal layer $M_T$ of the interconnect structure 20A and the upper electrode C2 of the capacitor structure 20B. As the vertical spacing $S_V$ of the capacitor structure 20B increases, the lateral spacing $S_L$ between the interconnect structure 20A and the capacitor structure 20B may also be correspondingly increased.

Figure 3:
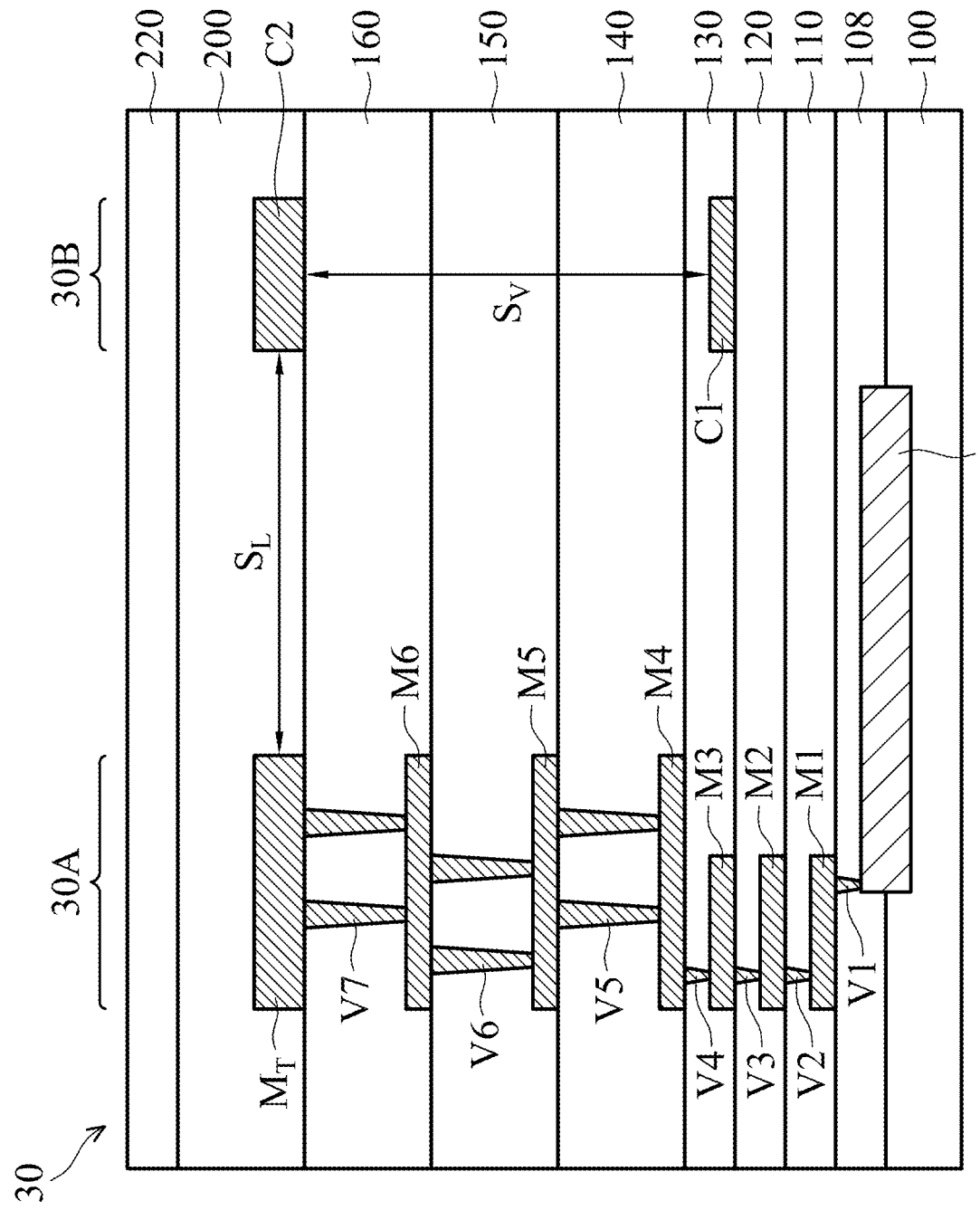
FIG. 3 illustrates a cross-sectional view of a semiconductor device, according to yet other embodiments of the present disclosure.

FIG. 3 illustrates a cross-sectional view of a semiconductor device 30, according to yet other embodiments of the present disclosure. The semiconductor device 30 includes an interconnect structure 30A and a capacitor structure 30B. In comparison with the semiconductor device 20 shown in FIG. 2, the semiconductor device 30 further includes a sixth inter-metal dielectric layer 160, a sixth metal layer M6, and a via V7. In some embodiments, the sixth inter-metal dielectric layer 160 may include similar materials to those of the fourth inter-metal dielectric layer 140 or the fifth inter-metal dielectric layer 150, and may be formed using similar methods (refer to the inter-metal dielectric layer 300 in FIGS. 1A and 1B described above), and the details are not described again herein to avoid repetition. In some embodiments, the sixth inter-metal dielectric layer 160 is interposed between the lower electrode C1 and the upper electrode C2 of the capacitor structure 30B.

In comparison with the semiconductor device 20, the semiconductor device 30 has a larger vertical spacing $S_V$, measured between the lower electrode C1 and the upper electrode C2 of the capacitor structure 30B, across the sixth inter-metal dielectric layer 160, the fifth inter-metal dielectric layer 150, the fourth inter-metal dielectric layer 140, and the portion of the third inter-metal dielectric layer 130, where the vertical spacing $S_V$ may be between about 15 μm and 22 μm, for example, 20 μm. As mentioned previously, the vertical spacing $S_V$ and the lateral spacing $S_L$ are equal, or the lateral spacing $S_L$ needs to be larger than the vertical spacing $S_V$, for example, the lateral spacing $S_L$ is 2 to 10 times the vertical spacing $S_V$. Such arrangement can ensure that the voltage tolerance of the semiconductor device 30 in operation is in the direction between the lower electrode C1 and the upper electrode C2 of the capacitor structure 30B, while preventing breakdown voltage between the top metal layer $M_T$ of the interconnect structure 30A and the upper electrode C2 of the capacitor structure 30B. As the vertical spacing $S_V$ of the capacitor structure 30B increases, the lateral spacing $S_L$ between the interconnect structure 30A and the capacitor structure 30B may also be correspondingly increased.

As the vertical spacing $S_V$ of the semiconductor device 10, the semiconductor device 20, and the semiconductor device 30 are continuously increased, the voltage tolerance thereof may be increased accordingly. For example, the semiconductor device 10 may have a maximum breakdown voltage of 5 kV, the semiconductor device 20 may have a maximum breakdown voltage of 10 kV, and the semiconductor device 30 may have a maximum breakdown voltage of 20 kV. However, if a device with higher voltage tolerance were to be fabricated, a larger circuit space may be occupied. Therefore, depending on the design and application requirements, the number of the relatively thicker inter-metal dielectric layers used in the present disclosure may be adjusted. The inter-metal dielectric layers of the present disclosure, through the arrangement of dielectric sublayers with different stress type, may increase the thickness of the inter-metal dielectric layers to enhance the breakdown voltage of the semiconductor device, and to prevent warpage occurring on the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first metal layer,
   a second metal layer, wherein from a top view, each of the first metal layer and the second metal layer has round corners; and
   an inter-metal dielectric layer disposed between the first metal layer and the second metal layer, wherein the inter-metal dielectric layer comprises:
   a first dielectric layer disposed on the first metal layer and in direct contact with the first metal layer, wherein the first dielectric layer has a stress value less than 0;
   a second dielectric layer disposed on the first dielectric layer, wherein the second dielectric layer has a stress value greater than 0; and
   a third dielectric layer disposed on the second dielectric layer, wherein the third dielectric layer has a stress value less than 0, wherein a thickness of the third dielectric layer is greater than a thickness of the second dielectric layer, and the thickness of the second dielectric layer is greater than a thickness of the first dielectric layer.

2. The semiconductor device of claim 1, wherein the round corners have a radius of curvature between 0.01 μm and 0.2 μm.

3. The semiconductor device of claim 1, wherein an absolute value of the stress of the third dielectric layer is greater than an absolute value of the stress of the first dielectric layer.

4. The semiconductor device of claim 1, further comprising a via penetrating through the inter-metal dielectric layer and electrically coupling the first metal layer and the second metal layer to form an interconnect structure.

5. The semiconductor device of claim 4, further comprising a capacitor structure, wherein the interconnect structure and the capacitor structure have a lateral spacing between 8 μm and 30 μm.

6. The semiconductor device of claim 5, wherein the capacitor structure further comprises:
   a lower electrode; and
   an upper electrode, wherein the upper electrode and the lower electrode have a vertical spacing, wherein the lateral spacing is greater than or equal to the vertical spacing.

7. The semiconductor device of claim 6, wherein one or more of the inter-metal dielectric layer is disposed between the upper electrode and the lower electrode.

8. The semiconductor device of claim 1, wherein the first dielectric layer and the second dielectric layer conformally cover the first metal layer, and the third dielectric layer has a planar top surface.

9. The semiconductor device of claim 1, wherein the inter-metal dielectric layer further comprises one or more dielectric layers disposed on the third dielectric layer.

10. The semiconductor device of claim 1, further comprising a first protection layer covering the second metal layer and a second protection layer disposed on the first protection layer, wherein a material of the first protection layer is different from a material of the second protection layer.

11. The semiconductor device of claim 1, further comprising an inter-layer dielectric layer disposed under the first metal layer.

12. A method forming a semiconductor device, comprising:
   forming a first metal layer on an inter-layer dielectric layer;
   forming an inter-metal dielectric layer on the first metal layer, wherein steps of forming the inter-metal dielectric layer comprise:
   conformally depositing a first dielectric layer on the first metal layer using a first deposition method, wherein the first dielectric layer has a stress value less than 0;
   conformally depositing a second dielectric layer on the first dielectric layer using a second deposition method different from the first deposition method, wherein the second dielectric layer has a stress value greater than 0; and
   depositing a third dielectric layer on the second dielectric layer using the first deposition method; and
   forming a second metal layer on the inter-metal dielectric layer, wherein from a top view, the first metal layer and the second metal layer are formed with round corners.

13. The method of claim 12, wherein the first deposition method comprises plasma-enhanced chemical vapor deposition, and the second deposition method comprises sub-atmospheric chemical vapor deposition.

14. The method of claim 12, further comprising planarizing a top surface of the third dielectric layer before forming the second metal layer.

15. The method of claim 12, wherein an operating pressure of the first deposition method is less than an operating pressure of the second deposition method.

16. The method of claim 12, wherein a power consumption for depositing the third dielectric layer is greater than a power consumption for depositing the first dielectric layer.

17. The method of claim 12, wherein the round corners have a radius of curvature between 0.01 μm and 0.2 μm.

18. The method of claim 12, further comprising covering a first protection layer on the second metal layer, and forming a second protection layer on the first protection layer.

* * * * *